(12) United States Patent
Einav

(10) Patent No.: US 8,735,290 B2
(45) Date of Patent: May 27, 2014

(54) AMORPHOUS GROUP III-V SEMICONDUCTOR MATERIAL AND PREPARATION THEREOF

(75) Inventor: Moshe Einav, Kfar Uriyah (IL)

(73) Assignee: Mosaic Crystal Ltd., Herzeliya, Pituach (IL)

(*) Notice: Subject to any disclaimer, the term of this patent is extended or adjusted under 35 U.S.C. 154(b) by 679 days.

(21) Appl. No.: 12/744,028

(22) PCT Filed: Nov. 19, 2008

(86) PCT No.: PCT/IL2008/001519
§ 371 (c)(1),
(2), (4) Date: Aug. 18, 2010

(87) PCT Pub. No.: WO2009/066286
PCT Pub. Date: May 28, 2009

(65) Prior Publication Data
US 2010/0311229 A1    Dec. 9, 2010

Related U.S. Application Data

(60) Provisional application No. 60/989,334, filed on Nov. 20, 2007, provisional application No. 61/083,313, filed on Jul. 24, 2008.

(51) Int. Cl.
*H01L 21/8252* (2006.01)
*H01L 21/18* (2006.01)
*H01L 27/10* (2006.01)

(52) U.S. Cl.
USPC ........... 438/688; 438/365; 438/483; 438/604; 204/192.15; 204/192.17

(58) Field of Classification Search
None
See application file for complete search history.

(56) References Cited

U.S. PATENT DOCUMENTS

| 5,976,398 A | 11/1999 | Yagi |
| 6,288,417 B1 * | 9/2001 | Nickel et al. ................ 257/103 |
| 6,566,595 B2 | 5/2003 | Suzuki |
| 2002/0100910 A1 | 8/2002 | Kordesch |
| 2005/0155641 A1 | 7/2005 | Fafard |
| 2010/0136770 A1 * | 6/2010 | Einav ............................ 438/483 |

FOREIGN PATENT DOCUMENTS

WO   WO 2008/102358   8/2008

OTHER PUBLICATIONS

Chang et al. "Photocurrent studies of the carrier escape process from InAs self-assembled quantum dots." *Physical Review*. vol. 62. No. 11. 2000. pp. 6959-6962.
Kim et al. "Near room temperature droplet epitaxy for fabrication in InAs quantrum dots." *Applied Phys Let*. vol. 85. No. 24. 2004. pp. 5893-5895.
Koo et al. "Photocunductivity in nanocrystalline GaN and amorphous GaON." *J. Appl. Phys.* vol. 99. 2006. 7 pages.

(Continued)

*Primary Examiner* — Zandra Smith
*Assistant Examiner* — Pamela E Perkins
(74) *Attorney, Agent, or Firm* — Merchant & Gould P.C.

(57) ABSTRACT

A reactive evaporation method for forming a group III-V amorphous material attached to a substrate includes subjecting the substrate to an ambient pressure of no greater than 0.01 Pa, and introducing active group-V matter to the surface of the substrate at a working pressure of between 0.05 Pa and 2.5 Pa, and group III metal vapor, until an amorphous group III-V material layer is formed on the surface.

16 Claims, 10 Drawing Sheets

(56) References Cited

OTHER PUBLICATIONS

Lanke et al. "Effect of Ion-energy on the properties of amorphous GaN films produced by ion-assisted deposition." *Mod. Phy. Let.* vol. 15. No. 28 & 29. 2001. pp. 1355-1360.

Wang et al. "Real-time x-ray studies of gallium nitride nanodot formation by droplet heteroepitaxy." *J. of Applied Phy.* vol. 102. 2007. pp. 10 pages.

\* cited by examiner

AMORPHOUS GROUP III-V SEMICONDUCTOR MATERIAL AND PREPARATION THEREOF

This application is a National Stage Application of PCT/IL2008/001519, filed 19 Nov. 2008, which claims benefit of U.S. Ser. No. 60/989,334, filed 20 Nov. 2007 and U.S. Ser. No. 61/083,313, filed 24 Jul. 2008 and which applications are incorporated herein by reference. To the extent appropriate, a claim of priority is made to each of the above disclosed applications.

FIELD OF THE DISCLOSED TECHNIQUE

The disclosed technique relates to amorphous materials, in general, and to preparation of an amorphous group semiconductor material, in particular.

BACKGROUND OF THE DISCLOSED TECHNIQUE

An amorphous material is a solid in which the atoms exhibit no long range order and in which the internal structure is irregular or random, as opposed to a crystalline material, which has a regular repeating internal structure. An example of an amorphous material is ordinary window glass, which is formed when molten silicate is cooled and acquires high viscosity, without allowing a regular crystal lattice to form. The amorphous state of the glass results in various useful optical properties, such as its transparency. The presence of various ingredients (e.g., Na, Ca, B, Pb in addition to silica) may have a significant influence on the final properties of the amorphous material (e.g., its color, transparency, softening point or glass transition temperature, $T_g$).

Group-III metals of the periodic table (i.e., aluminum, gallium and indium) can form semiconductor compounds with group-V elements of the periodic table (e.g., nitrogen, phosphorous and arsenic). For example, group-III metals can form arsenide materials, such as gallium arsenide (GaAs), or phosphide materials, such as gallium phosphide (GaP). GaAs is a semiconductor widely used, for example, in microwave frequency integrated circuits, light emitting diodes and solar cells. GaP is used, for example, in red, orange and green light emitting diodes.

Group-III metals can also form nitrides by interacting with nitrogen (N), i.e., aluminum nitride (AlN), gallium nitride (GaN) and indium nitride (InN). Group-III metal nitrides are semiconductors having various energy gaps (between two adjacent allowable bands), e.g., a narrow gap of 0.7 eV for InN, an intermediate gap of 3.4 eV for GaN, and a wide gap of 6.2 eV for AlN.

Solid group III-V semiconductor materials have an ordered crystalline structure, giving them advantageous chemical and physical properties, such that electronic devices made from group III-V material can operate at conditions of high temperature, high power and high frequency. Electronic devices made from group III-V material may emit or absorb electromagnetic radiation having wavelengths ranging from the UV region to the IR region of the spectrum, which is particularly relevant for constructing light emitting diodes (LED), solid-state lights and the like. Amorphous group III-V materials have certain useful optical properties, and may be employed in a wide variety of additional applications, such as solar batteries and full color displays.

Techniques for preparation of amorphous materials include: rapid solidification, thin-film deposition processes (e.g., sputter deposition and chemical vapor deposition), and ion implantation. In rapid solidification, the amorphous material is produced directly from a liquid melt, which is cooled very quickly such that there is insufficient time for an ordered crystal structure to form. Thin-film deposition involves depositing a thin film onto a substrate, or on previously deposited layers on the substrate.

Sputter deposition is one type of thin film deposition technique. The atoms in a solid target material are ejected into a gas phase by ion bombardment. Each collision knocks off additional atoms, where the number of ejected atoms per incident ion (i.e., the sputter yield) is dependent on several factors, such as the energy of the incident ions, the respective masses of the ions and atoms, and the binding energy of the atoms in the solid. The ions are provided by a plasma, usually of a noble gas (e.g., argon). The ejected atoms are not in their thermodynamic equilibrium state, and tend to deposit on all surfaces in the vacuum chamber. Therefore a substrate in the chamber will end up being coated with a thin film having the same composition of the target material. The target can be kept at a relatively low temperature during sputter deposition, since no evaporation is involved. In reactive sputtering, the plasma gas includes a small amount of a non-noble gas, such as oxygen or nitrogen, which reacts with the material after it is sputtered from the target, resulting in the deposited material being the product of the reaction, such as an oxide or nitride.

Chemical vapor deposition (CVD) is another type of thin film deposition, where the film is formed by a chemical reaction. The substrate is exposed to a mixture of gases, which reacts with the substrate surface to produce the desired deposit, which condenses on the substrate. CVD is usually performed at high temperature in a furnace, or in a CVD reactor in which the substrate is heated. Unwanted reaction byproducts are usually produced in the reaction, which are removed by gas flow through the reaction chamber. Plasma may be used to enhance the rates and lower the temperatures of chemical reaction. Metal-organic chemical vapor deposition (MOCVD) involves organo-metallic compounds as the reactants, which reduce reaction temperature in comparison to ordinary CVD sources.

Ion implantation involves implanting ions of a first material in a second target material. The ions are electrostatically accelerated to a high energy, before impinging on the target material, such as on the surface of a substrate. The amount of material implanted, known as the dose, is the integral over time of the ion current. By controlling the dose and the energy, it is possible to change and disrupt the crystal structure of the target surface in such a way that an amorphous layer is formed. The impinging ions break chemical bonds within the target material, and form new bonds which are unorganized and not in thermodynamic equilibrium, resulting in the target material becoming amorphous.

An article entitled "Compositional and Structural Studies of Amorphous GaN Grown by Ion-assisted Deposition" to Lanke et al. (Material Research Society Symposium 2002), is directed to a method for growing amorphous GaN using an energetic nitrogen ion beam. Amorphous GaN films were prepared by electron beam evaporation of gallium metal in the presence of an energetic nitrogen ion beam (ion-assisted deposition). The films were deposited at room temperature using incident nitrogen ion energies in the range 40-900 eV. Compositional analysis was carried out on films grown on silicon and glassy carbon substrates. The analysis showed that the grown films can reasonably be considered amorphous GaN. Films deposited with nitrogen ion energy of around 500 eV are transparent across the visible, whereas lowering the ion energy below 300 eV caused the films to become progressively opaque.

U.S. Pat. No. 5,976,398 to Yagi, entitled "Process for manufacturing semiconductor, apparatus for manufacturing semiconductor, and amorphous material", is directed to an amorphous nitride III-V compound semiconductor, and an apparatus and process for its manufacture. The manufacturing process utilizes plasma-enhanced MOCVD. The semiconductor manufacturing apparatus includes a reactor, a first and second activation-supply portions, an exhaust pipe, a heater, and a substrate holder. The substrate holder holds a substrate inside the reactor, which is allowed to form a vacuum. Each activation-supply portion is composed of a pair of gas introducing pipes, a quartz pipe connected with the reactor, and a microwave waveguide (or alternatively, a radio frequency coil) for providing activation.

Plasma of a V group element (e.g., nitrogen plasma) is generated at the first activation-supply portion and introduced into the reactor. For example, $N_2$ gas is introduced from the gas introducing pipe, and a microwave oscillator supplies microwaves to the microwave waveguide, which induces a discharge in the quartz pipe and activates the $N_2$ gas. A metal organic compound containing a III group element (e.g., Al, Ga, In) is supplied by a gas introducing of the first activation-supply portion. An auxiliary material (e.g., He, Ne, Ar, $H_2$, $Cl_2$ $Fl_2$) is supplied by the gas introducing pipe of the second activation-supply portion. The auxiliary material (e.g., hydrogen plasma) reacts with an organic functioning group of the metal organic compound, including the III group element, to inactivate the organic functional group. The vaporized metallic organic compound and the plasma of the auxiliary material is added to the plasma of the V group element.

The heater heats the substrate to the appropriate temperature (e.g., from 200° C. to 400° C.). A film of amorphous material, containing the III group element and the V group element, is formed on the substrate. The film of the semiconductor compound contains the III group element and the V group element. For example, the amorphous material is hydrogenated amorphous gallium nitride. The amorphous material is suitable as an optical semiconductor for optoelectronic applications.

US Patent Application Pub. No. US 2002/0100910 to Kordesch, entitled "Band gap engineering of amorphous Al—Ga—N alloys", is directed to an amorphous semiconductor alloy including aluminum and gallium, and a method for its production, which utilizes sputter deposition. A semiconductor substrate is positioned on an anode inside a reactive sputter deposition chamber. The sputter deposition chamber also includes a sputter target on a target cathode. The sputter deposition chamber is coupled with an RF source and a matching network. The sputter target contains aluminum and gallium (e.g., a single integrated target with both aluminum and gallium, a single target with an aluminum portion and a gallium portion, or discrete targets of aluminum and gallium). The sputter target may also contain indium. Nitrogen gas is introduced into the sputter deposition chamber. The sputter deposition chamber is operated to promote reaction of the aluminum and gallium of the sputter target with the nitrogen. The semiconductor substrate is maintained at a deposition temperature (e.g., between about 77K to about 300K), selected to ensure that the grown alloy is amorphous. The relative proportions of aluminum and gallium are selected such that the amorphous alloy will have a band gap between about 3 eV and about 6 eV. The amorphous alloy has the chemical formula: $Al_xGa_{1-x}N$. The amorphous alloy may be doped, such as with a rare earth luminescent center, for various photonics applications.

A quantum dot (QD) is a nano crystal of a semiconductor material, spatially surrounded by material of a different conduction-phase (i.e., conducting, semiconducting or dielectric material). In a quantum dot, an exciton (i.e., an electron-hole pair) may be formed by excitation of a valence electron. A quantum dot represents a quantum mechanical "atom-like" structure, in which electrons can be excited to very few higher (non-bonding) orbitals, leaving "holes" behind them. The excitation of electrons in a quantum dot may be electric excitation, photonic excitation, or thermal excitation.

In traditional quantum dot structure, nano crystals (i.e., QDs) of lower band gap energy ($E_g$) are embedded within a crystalline structure matrix of a material having higher $E_g$. For example germanium QDs may by embedded within a silicon crystal. Alternatively, nano-crystal QDs may be embedded within an amorphous matrix. In this case, one can use a single chemical material constructing a two-phase composite material. Thus, the difference in band-gap energies between the QDs and the matrix material is derived from the two phases, namely the crystalline of the QDs and the amorphous of the surrounding matrix. Having identical ingredients, a crystalline phase generally has a lower $E_g$ than the amorphous phase. For example, this would be the case in GaAs QDs embedded within a GaAs amorphous matrix.

In a case where two chemical substances are involved in the composite material, further versatility rises. The crystalline phase of the QDs is less tolerant to material composition, whereas the amorphous one is more tolerant. In this case, one can get QDs of different band-gap energy conditions, namely QDs having lower $E_g$ within a higher $E_g$ matrix (i.e., as in the usual case described above), or QDs having higher $E_g$ within lower $E_g$ matrix. Such amorphous matrix having nano-crystallites embedded therein is referred to as "Amorphous-Nano-Crystalline" (ANC). An example for such matter would be the InGaN system.

In the case of a single chemical substance, the band gap energy of a superiorly amorphous material (i.e., inhibiting particle order on the scale of nanometers or shorter) is higher than an ANC material of the same substance (i.e., an ordered more crystalline material has a lower $E_g$ than its amorphous equivalent). In a mixed phase composite material, the nano crystalline phase may be of different composition than the surrounding amorphous phase. For example, in the material system of InGaN, there might be more indium in the crystalline phase (i.e., less indium in the amorphous one) or vice versa, less indium in the crystalline phase (i.e., more indium in the amorphous phase). In the latter case one may obtain a larger $E_g$ in the crystallites and a smaller $E_g$ in the amorphous matrix.

An ANC layer may be wafered or stacked between two superiorly amorphous layers. The superiorly amorphous layer may have a band gap energy (hereinafter, "$E_g$") value smaller or greater than the $E_g$ of the nano-crystallites. Therefore, in the case of greater $E_g$, free charge carriers would be spatially trapped within the ANC layer, since they would not have sufficient energy to pass the superiorly amorphous layer energetic barrier. In the case of smaller $E_g$, free charge carriers would be spatially "released" upon generation. When each of the capping superiorly amourphous layers is doped with n-type and p-type materials, respectively, a quantum dot p-i-n junction is obtained. In such a quantum dot p-i-n junction, free electrons and holes of the ANC layer may combine and emit a photon, or migrate toward the n-type doped and p-type doped amorphous layers, respectively, if radiated excessively. If the $E_g$ of the ANC layer is smaller than the $E_g$ of the amorphous layer, free charge carriers formed by photons within the amorphous layer may easily "escape" to the surrounding layers (e.g., amorphous material doped with p-type material). If electrodes are coupled to each of the amorphous layers, then a quantum dot p-i-n junction, yielding a quantum dot electronic device may be obtained. If the electrodes become electrically charged by an external power supply, then electric current may be generated through the quantum dot p-i-n junction, and a light emitting device may be employed.

A quantum dot electronic device may be employed as a photovoltaic (PV) cell. In a PV cell, free charge carriers (i.e., electrons and holes) are produced by the photovoltaic effect, and are induced to migrate under an electric field of a p-i-n junction, toward n-type and p-type doped caps. The photovoltaic effect takes place when a photon hits the PV cell, having a wavelength, equal to (or higher than) the band gap of a semiconductor material constructing the PV cell. That photon may be absorbed by an electron, pumping the electron from the valence band to the conduction band, leaving a hole and thus forming an exciton. Since the PV cell is capped within a p-i-n junction, the electron and the hole may migrate in the electric field of the junction, in opposite directions. If electrodes are coupled to each end of the p-i-n junction, then the electrodes become electrically charged. When the quantum dot PV cell is connected to an external circuit, an electric current may be generated between two electrodes on each side of the PV cell.

A PV cell may include a plurality of semiconductor materials, each having a different value of band gap energy, and absorbing photons of a different wavelength. In that case, the quantum dot PV cell may be employed as a solar cell, absorbing a plurality of wavelengths from the broad spectrum light of sunlight, and turning it into electricity. Quantum dot solar cells are known in the art.

U.S. Pat. No. 6,566,595 to Suzuki, entitled "Solar Cell and Process of Manufacturing the Same", is directed to a solar cell employing a quantum dot layer in a p-i-n junction. The solar cell includes a p-type semiconductor layer and an n-type semiconductor layer made of a first compound semiconductor material. At least one quantum dot layer is formed between the p-type semiconductor layer and the n-type semiconductor layer. The quantum dot layer is constructed of a second compound semiconductor material and has a plurality of projections (i.e., quantum dots) on its surface. The quantum dots are of different sizes on a single quantum dot layer, or on any one of the quantum dot layers.

The quantum dot layer is inserted in the i-type semiconductor layer of the p-i-n junction. Thus, light of wavelength corresponding to the practical forbidden band width of the quantum dot layer is absorbed, in addition to light of wavelength corresponding to the forbidden band width of the semiconductor material forming the p-n junction. This increases the photoelectric conversion efficiency of the solar cell. The forbidden band width of the quantum dot layer can be varied depending on the combination or compound crystal ratio of the semiconductor used for forming the quantum dot layer. Thus, the wavelength range in which the photoelectric conversion can be carried out may be extended, and a solar cell which allows photoelectric conversion of varying wavelengths at high efficiency corresponding to the incident light can be manufactured. In a process of manufacturing the solar cell according to Suzuki, the quantum dot layer may be formed by lithography and selective etching, or by self-growing mechanism. The semiconductor material used for forming the quantum dot layer may be a compound of a group III element and a group V element shown in the periodic table, such as InGaAs or GaAs.

US Patent Application Pub. No. US2005/0155641 to Fafard, entitled "Solar Cell with Epitaxially Grown Quantum Dot Material", is directed to a photovoltaic solar cell having a subcell structure, and to a method for making such a solar cell. The solar cell is a monolithic semiconductor photovoltaic solar cells including at least one subcell, having a self-assembled quantum dot material. Each of the subcells of the solar cell exhibits a different bandgap energy value, and thus absorbs photons of different wavelengths. The subcells are disposed in order of increasing effective band gap energy, with the subcell having the lowest effective band gap energy being closest to the substrate. A barrier semiconductor layer is formed between each pair of subcells of the solar cell.

The method for making the solar cell includes epitaxial growth of the quantum dot material. The growth temperature of the quantum dot layers is used to adjust the shape and composition of the quantum dots. The temperature during the overgrowth of the barrier of each quantum dot layer may be varied at different stages of the overgrowth, to further control the size and composition of the quantum dots and therefore the absorption characteristics of self-assembled quantum dot material. The combination of epitaxial growth parameters is chosen to obtain quantum dot layers having a high in-plane density of highly uniform quantum dots having desired energy levels. Such growth parameters are: growth temperature, the group-V over-pressure or the III/V ratio, the quantum dot material, the amount of material used to obtain the self-assembled growth transition between a uniform quasi two-dimensional film to three-dimensional islands, the growth rate or the pauses used during the growth, and the overgrowth conditions such as growth temperature and growth rate.

SUMMARY OF THE DISCLOSED TECHNIQUE

In accordance with the disclosed technique, there is thus provided a reactive evaporation deposition method for forming a group III-V amorphous material film attached to a substrate. The method includes the procedures of subjecting the substrate to an ambient pressure of no greater than 0.01 Pa, and introducing active group-V vapor to the surface of the substrate at a working pressure of between 0.05 Pa and 2.5 Pa, and group-III metal vapor, until an amorphous group III-V material layer is formed on the surface. The amorphous material may include nano-crystallites therein, the size thereof determined according to the thickness of the amorphous material and the temperature of the substrate during the reactive evaporation.

According to another aspect of the disclosed technique, a method for forming a group III-V amorphous material attached to a substrate is disclosed. The method includes the procedures of subjecting a substrate to an ambient pressure of no greater than 0.01 Pa, and introducing a group-III metal vapor to the surface of the substrate at a base pressure of at least 0.01 Pa, until a plurality of group-III metal drops form on the surface. The method further includes the procedures of introducing active group-V vapor to the surface at a working pressure of between 0.05 Pa and 2.5 Pa, until group III-V material molecules form on the group-III metal drops, and maintaining the working pressure and the active group-V matter until the group III-V material molecules diffuse into the group-III metal drops, forming group III-V/group-III solution drops, and until the group III-V/group-III solution drops turn into a wetting layer on the substrate. The method further includes the procedure of continuing to increase the concentration of group III-V material molecules in the wetting layer until all the group-III metal atoms contained in the wetting layer are exhausted, and the wetting layer transforms into an amorphous group III-V material layer. Increasing the concentration of group III-V molecules in the wetting layer is accomplished by maintaining the supply of active group-V matter until all the group-III metal atoms contained in the wetting layer are exhausted. Alternatively, the concentration of group III-V molecules in the wetting layer is increased by heating the wetting layer until all the group-III metal atoms remaining in the wetting layer are evaporated.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

The disclosed technique overcomes the disadvantages of the prior art by providing an amorphous group III-V material and a method for its preparation. According to the disclosed technique, a wetting layer of group III-V/group-III metal solution is formed by exposing group-III metal drops, formed on a substrate, to active group-V vapor phase matter. The wetting layer is further exposed to active group-V vapor phase matter, which reacts with the group-III atoms on the surface of the wetting layer, to form group III-V molecules. The group III-V molecules diffuse into the bulk of the solution, increasing its viscosity. Eventually, all the group-III atoms are used up in the reaction, and the wetting layer transforms into an amorphous group III-V layer.

According to another embodiment of the disclosed technique, group-III vapor and active group-V vapor phase matter are simultaneously introduced to the surface of a substrate, until an amorphous group III-V layer is formed on the substrate, by reactive evaporation. During the presently described process, the substrate, on which the amorphous group III-V is formed, may either remain unheated (i.e., at room temperature of 25° C.), or brought to a different temperature (e.g., heated by a heater). It is noted, that although the following description refers to a wafer-like substantially flat substrate, on which the amorphous layer is formed, the substrate may be of any other geometrical shape, since the amorphous material possesses high flexibility (i.e., mainly in small scale). For example, the substrate may be of a fiber-like shape, having a circular cross section (e.g., carbon fiber), wherein the amorphous layer is formed circumferentially around the fiber-like substrate, yielding a fiber uniformly "coated" with amorphous material. It is noted, that the term group III-V herein, refers to a compound of at least one group-III matter of the periodic table and at least one group-V matter of the periodic table.

Figure 1:
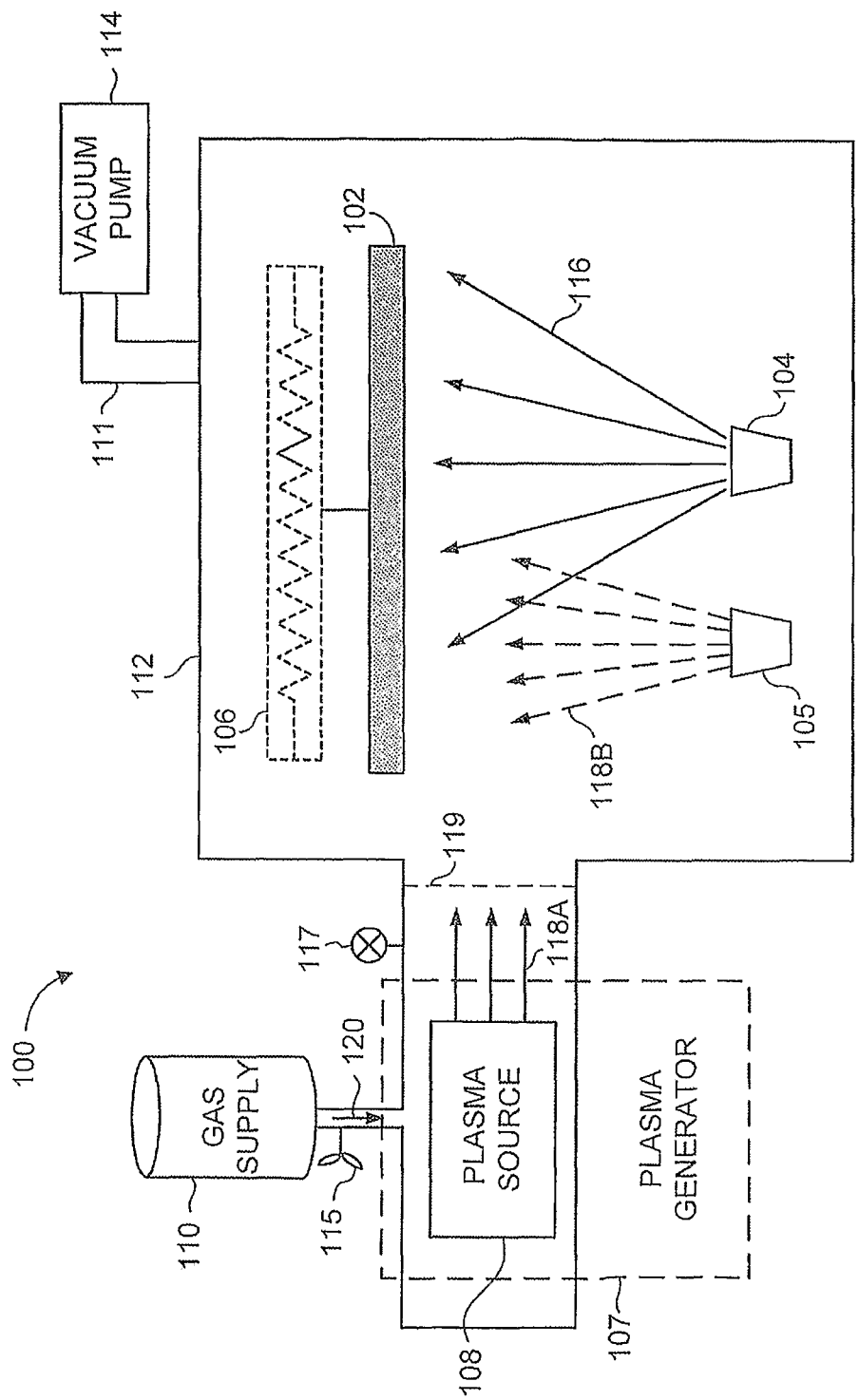
FIG. 1 is a schematic illustration of a system for amorphous group III-V material formation, constructed and operative in accordance with an embodiment of the disclosed technique.
Figure 1A:
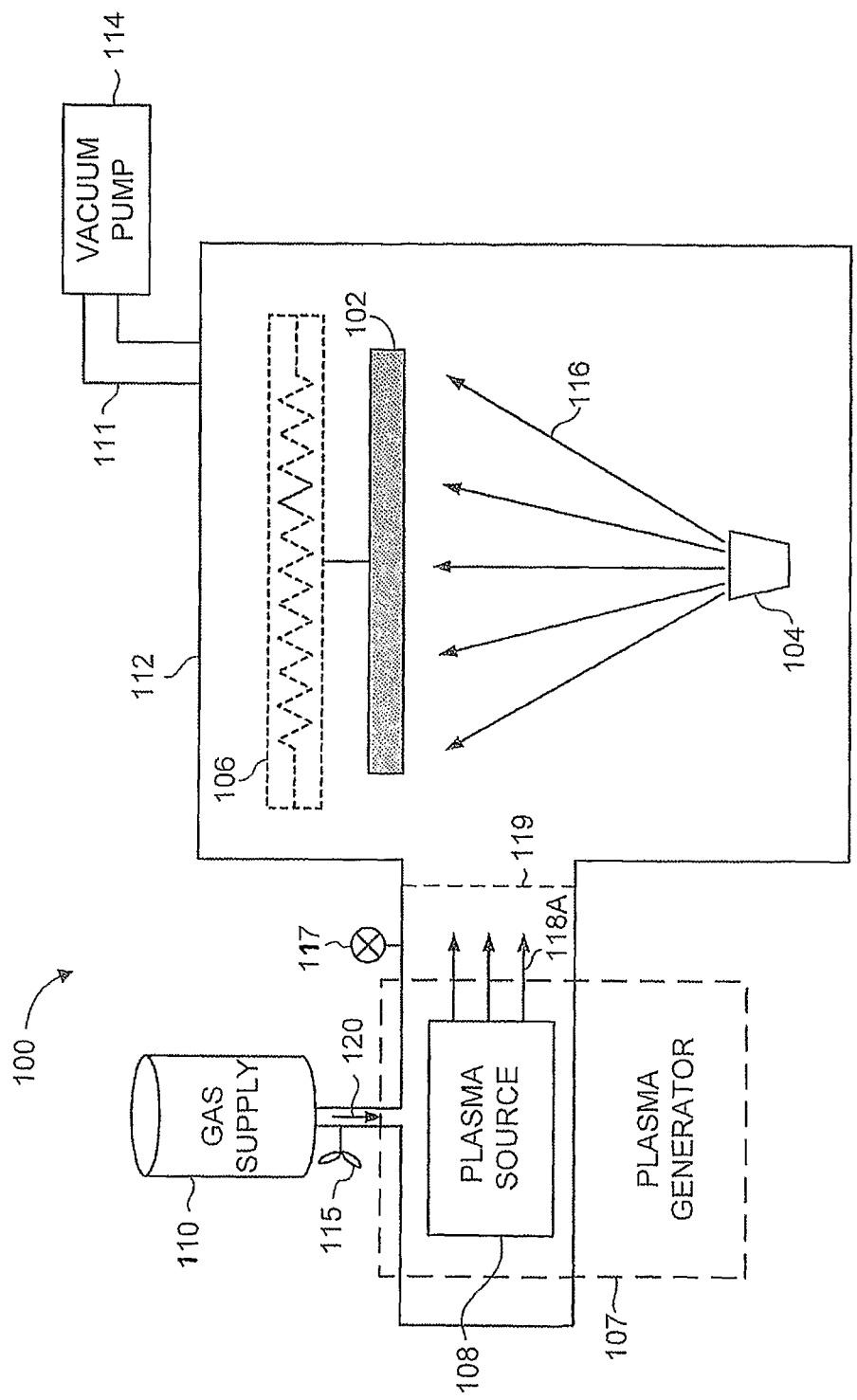
FIG. 1A is a schematic illustration of the system of FIG. 1, in which nitrogen plasma is employed to form group-III nitride.
Figure 1B:
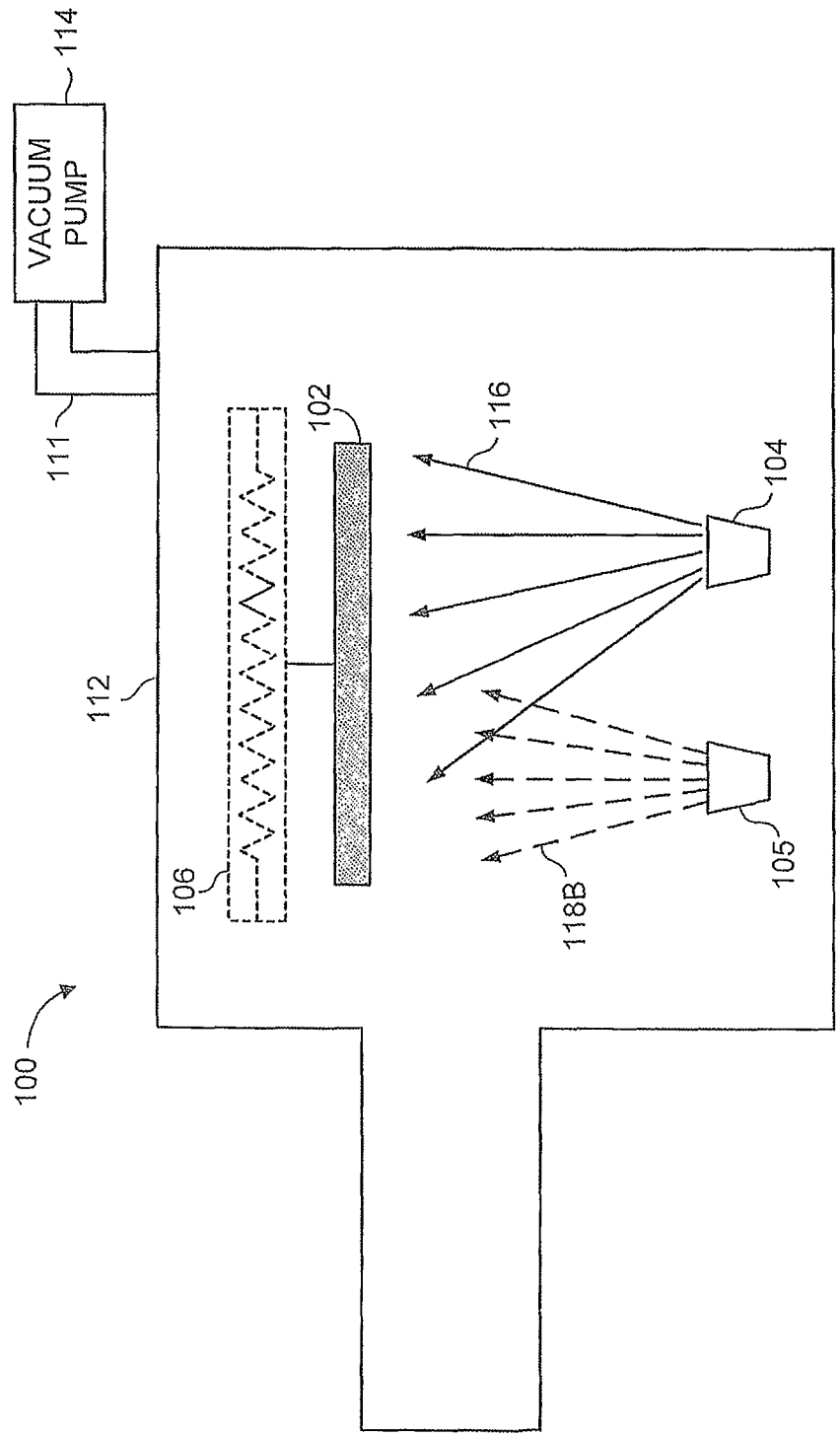
FIG. 1B is a schematic illustration of the system of FIG. 1, in which phosphorous or arsenic are evaporated to form group III-V material.

Reference is now made to FIGS. 1, 1A and 1B. FIG. 1 is a schematic illustration of a system, generally referenced 100, for amorphous group III-V material formation, constructed and operative in accordance with an embodiment of the disclosed technique. FIG. 1A is a schematic illustration of the system of FIG. 1, in which nitrogen plasma is employed to form group-III nitride. FIG. 1B is a schematic illustration of the system of FIG. 1, in which phosphorous and arsenic are evaporated to form group III-V material. System 100 includes a substrate 102, a group-III metal vapor source 104, a nitrogen plasma generator 107, a plasma source 108, a nitrogen gas supply 110, a vacuum chamber 112, a vacuum pump 114, and a group-V vapor source 105. For example, group-V vapor source 105 may be a solid crucible of phosphorous or arsenic, which provides phosphorous or arsenic vapors when heated.

Vacuum pump 114 is coupled with vacuum chamber 112, via vacuum pipe 111. Substrate 102 is disposed inside vacuum chamber 112. Substrate 102 may be a wafer formed of silicon, glass, graphite, polymer, stainless steel, and the like. Alternatively, substrate 112 may be composed of graphite or glass fibers, or polymer or metallic fibers. Group-III metal vapor source 104 is disposed inside vacuum chamber 112, opposite to the lower surface of substrate 102, such that group-III metal vapors 116 are directed from group-III metal vapor source 104 toward the lower surface of substrate 102. Group-III metal vapor source 104 may be, for example, a source of gallium vapor, indium vapor or aluminum vapor. In the configuration of system 100 depicted in FIG. 1, the lower surface of substrate 102 is the active surface, whereas the upper surface of substrate 102 is the non-active surface.

Nitrogen gas supply 110 is coupled with nitrogen plasma source 108. Nitrogen gas supply 110 may be a cylinder of nitrogen gas ($N_2$), which is connected by a pipe to nitrogen plasma source 108. The pipe includes a leak valve 115 for regulating the pressure of the nitrogen gas in plasma source 108. A pressure gauge 117 is coupled with plasma generator 107, for monitoring the pressure therein.

Nitrogen plasma generator 107 is located at one side of vacuum chamber 112, in proximity and opposite to the active surface of substrate 102. Nitrogen plasma generator 107 is located around plasma source 108. Nitrogen plasma generator 107 may be, for example, a 100 kHz transformer type Plasmatron. Nitrogen plasma generator 107 introduces active nitrogen (e.g., N or N$^+$) 118A to the reactor region of vacuum chamber 112 (i.e., where substrate 102 is located) via a shutter 119. Group-V vapor source 105 (e.g., phosphorous or arsenic heated crucible) is positioned adjacent to group-III metal vapor source 104 and directs group-V vapor 118B (e.g., phosphorous or arsenic) toward the active surface of substrate 102.

Nitrogen gas supply 110 directs pure nitrogen 120 into plasma generator 107. Using leak valve 115 and pressure gauge 117, the pressure of nitrogen gas 120 is set to approximately 5 Pascal (Pa). Nitrogen plasma generator 107 is operated at approximately 100 kHz, and ignites nitrogen gas 120 to produce active nitrogen matter 118A. After shutter 119 is opened, active nitrogen 118A expands toward and comes in contact with the active surface of substrate 102. Similarly, group-V vapor 1188 (e.g., phosphorous or arsenic) are directed toward and come in contact with the active surface of substrate 102.

It is noted that the disclosed technique may be applied to the formation of an amorphous material made up of any group III-V material, such as gallium nitride (GaN), indium nitride (InN), aluminum nitride (AlN), gallium arsenide (GaAs), gallium phosphide (GaP), indium gallium nitride (InGaN), aluminum gallium nitride (AlGaN), aluminum indium nitride (AlInN), indium phosphide (InP), indium gallium arsenide (InGaAs), aluminum gallium arsenide (AlGaAs), indium gallium phosphide (InGaP), or a mixture thereof. Accordingly, the group-III metal may include gallium, indium or aluminum, or a mixture thereof, with any required adaptations to temperature and pressure in the present disclosure. The group-V matter may include nitrogen, arsenic or phosphorous, or a mixture thereof, with any required adaptations. For example, in order to obtain a layer of InGaN, nitrogen plasma is also introduced into the vacuum chamber, as well as a mixture of gallium and indium vapors.

It is further noted, that as depicted in FIG. 1, both active nitrogen and other group-V elements may be employed. In FIG. 1A, system 100 employs only active nitrogen plasma to form group-III nitride, whereas in FIG. 1B, system 100 employs only group-V vapor, other than nitrogen, to form group III-V material. It would be appreciated, that a system according to the disclosed technique may include a plasma source as well as a plurality of vapor sources of different materials inside the vacuum chamber.

Figure 2A:
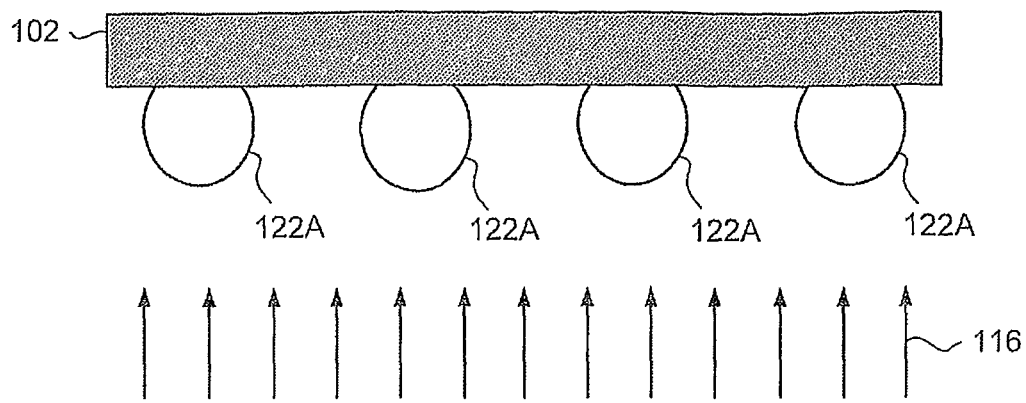
FIG. 2A is a schematic illustration of the substrate of the system of FIG. 1, at the stage when group-III metal drops are formed on the substrate, in accordance with another embodiment of the disclosed technique.
Figure 2B:
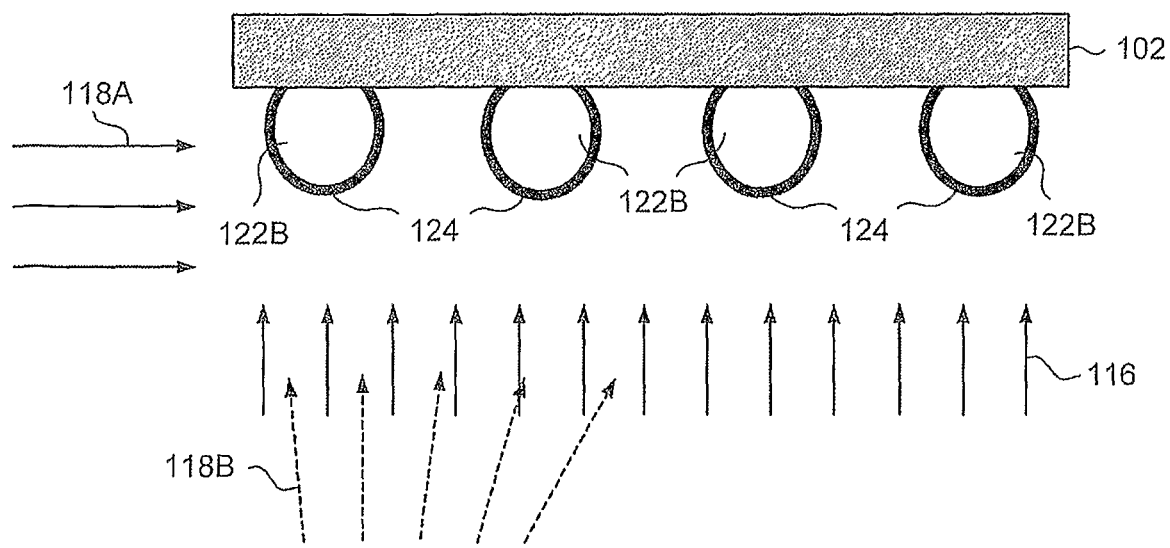
FIG. 2B is a schematic illustration of the substrate of FIG. 2A at a further stage, when group III-V material molecules are formed on the group-III metal drops.
Figure 2C:
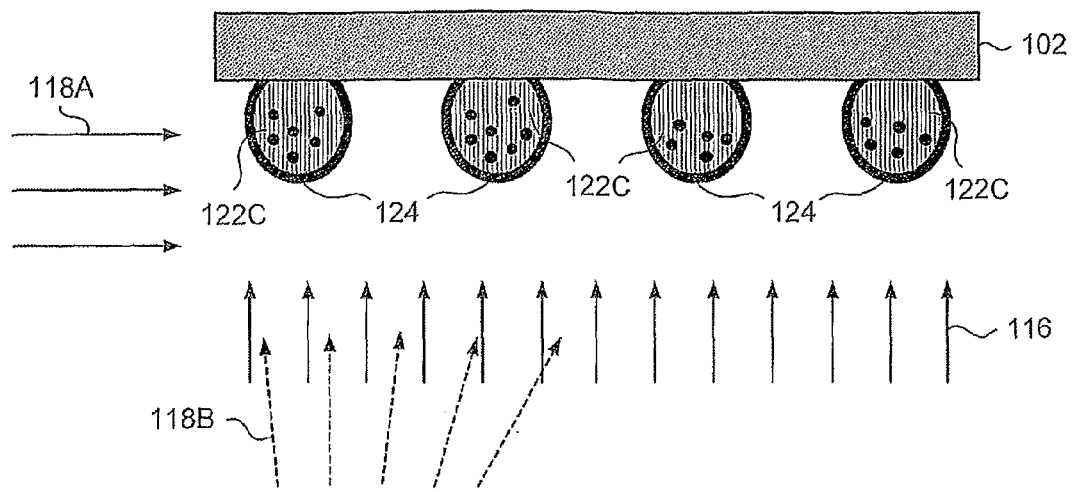
FIG. 2C is a schematic illustration of the substrate of FIG. 2B at a further stage, when the group III-V material molecules diffuse into the group-III metal drops, forming group III-V/group-III solution drops.
Figure 2D:
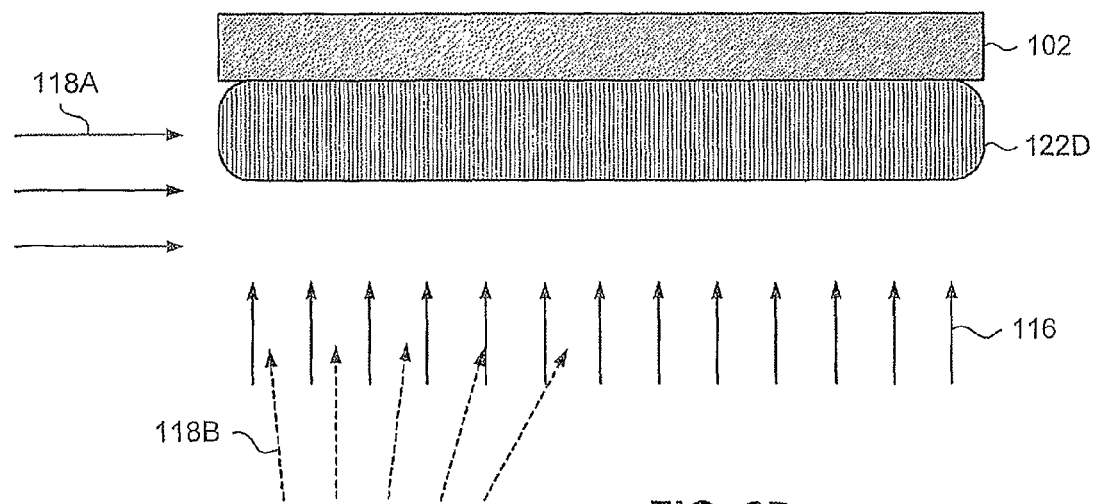
FIG. 2D is a schematic illustration of the substrate of FIG. 2C at a further stage, when the group III-V/group-III solution drops transform into a wetting layer.
Figure 2E:
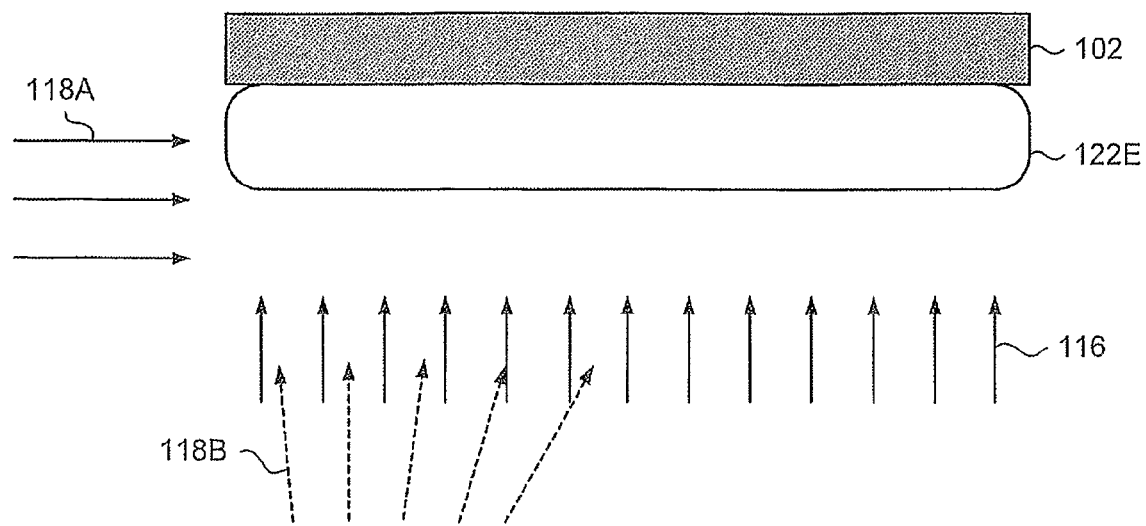
FIG. 2E is a schematic illustration of the substrate of FIG. 2D at a further stage, when the wetting layer transforms into an amorphous group III-V material layer.

Reference is now made to FIGS. 2A, 2B, 2C, 2D and 2E. FIG. 2A is a schematic illustration of the substrate of the system of FIG. 1, at the stage when group-III metal drops are formed on the substrate, in accordance with another embodiment of the disclosed technique. FIG. 2B is a schematic illustration of the substrate of FIG. 2A at a further stage, when group III-V molecules are formed on the group-III metal drops. FIG. 2C is a schematic illustration of the substrate of FIG. 2B at a further stage, when the group III-V molecules diffuse into the group-III metal drops, forming group III-V/group-III solution drops. FIG. 2D is a schematic illustration of the substrate of FIG. 2C at a further stage, when the group III-V/group-III solution drops transform into a wetting layer. FIG. 2E is a schematic illustration of the substrate of FIG. 2D at a further stage, when the wetting layer transforms into an amorphous group III-V material layer. It is noted, that the disclosed technique may be employed with any group-V material, with required adaptations to the system, as depicted in FIG. 1A for nitrogen and 1B for group-V vapor, other than nitrogen, for example, phosphorous or arsenic.

With reference to FIG. 2A, group-III metal vapor source 104 (FIG. 1) emits group-III metal vapors 116 toward the active surface of substrate 102. When gallium is used, gallium vapors which arrive at the active surface of substrate 102, are generated at a temperature of approximately 1000° C. The temperature of the introduced gallium vapors may differ from 1000° C., according to the desired deposition rate. Vacuum pump 114 is employed to bring the base pressure inside vacuum chamber 112 to at least 0.01 Pa. Group-III metal vapors 116 reach the active surface of substrate 102, and condense into group-III metal liquid drops 122A. Group-III metal liquid drops 122A include group-III metal atoms. The tendency of group-III metal drops 122A to remain substantially spherical or to spread easier depends on the composition of substrate 102, which determines the repelling or attracting interaction with the surface tension of group-III metal drops 122A. The precise size and quantity of group-III metal drops 122A depends, in addition to surface tension forces, on the pressure applied within vacuum chamber 112 (FIG. 1), on the temperature of substrate 102, and on the vapor pressure of group-III metal vapors 116.

Group-III metal drops 122A may condense in a uniform manner, such that each of group-III metal drops 122A is substantially the same size as other drops 122A, and is separated by substantially the same distance from other drops 122A. Alternatively, group-III metal drops 122A may condense in a non-uniform manner, such that each of drops 122A is of different size, and is separated by varying distance from other drops 122A. The uniformity of the size of group-III metal drops 122A and of the distance between drops 122A depends on the uniformity of the active surface of substrate 102 and the presence of contaminants and defects therein. Therefore, the active surface of substrate 102 may be pre-treated to clean the surface of any contaminants, in order for group-III metal drops 122A to condense in a uniform manner. For example, the active surface of substrate 102 may be pre-treated by the application of active nitrogen, or by heating substrate 102 to a sufficiently high temperature (e.g., 850° C.), or a combination of both.

With reference to FIG. 2B, after the condensation of group-III metal drops 122A, plasma source 108 directs active nitrogen 118A toward the active surface of substrate 102. Active nitrogen 118A reacts with the group-III metal atoms of group-III metal drops 122B. In case group-V sources, other than nitrogen, are employed, as in FIGS. 1 and 1B, group-V atoms of group-V vapor 118B react with the group-III metal atoms of group-III metal drops 122B. The reaction of active nitrogen 118A or group-V vapor 118B with group-III metal drops results in the formation of group III-V molecules 124 on the outer shell of group-III metal drops 122B. For example, in the case where nitrogen and gallium are used, GaN molecules are formed in accordance with the chemical reaction: Ga+N→GaN. Group III-V material molecules 124 may include a single molecule or a cluster of molecules on the outer shell of each of group-III metal drops 122B, for example, in accordance with the chemical reaction: nGa+nN→(GaN)$_n$.

With reference to FIG. 2C, after group III-V molecules 124 form on the outer shell of group-III metal drops 122B, group III-V molecules 124 begin to diffuse into the liquid group-III metal inside group-III metal drops 122B. The inner liquid of group-III metal drops 122B is gradually converted into a group III-V/group-III solution (e.g., GaN dissolved in liquid Ga), and group-III metal drops 122B transform into group III-V/group-III solution drops 122C.

Wetting is a physical phenomenon relating to the contact between a fluid material and a solid surface. When a liquid has a high surface tension, it will form droplets (similar to group-III metal drops 122A), whereas a liquid with low surface tension will spread out over a greater area. Wetting is the result of the minimization of interfacial energy. If a fluid conforms to the surface of a substrate and its thickness-to-area ratio is minimal, then the fluid is considered a wetting fluid. A fluid that does not conform to the surface of a substrate and forms droplets is considered a non-wetting fluid.

The wetting characteristic of a fluid with respect to a substrate is dependent on their chemical properties. Altering the chemical properties of a fluid may change its wetting characteristic relative to the substrate. For example, gallium is considered to be non-wetting, relative to a silicon substrate, on the one hand, and will therefore form drops on a silicon substrate. On the other hand, a GaN/Ga solution having a certain concentration is considered to be wetting, relative to a silicon substrate.

With reference to FIG. 2D, as the relative concentration of group III-V/group-III increases in group III-V/group-III solution drops 122C, the surface tension of group III-V/group-III solution drops 122C decreases. Since group III-V/group-III solution is considered wetting relative to substrate 102, solution drops 122C eventually spread and turn into a uniform wetting layer 122D, which evenly covers the entire surface of substrate 102. As group III-V/group-III solution drops 122C turn into wetting layer 122D, the thickness-to-area ratio of group III-V/group-III solution drops 122C decreases by an order of magnitude. The size of the liquid drops determines the rate at which the wetting layer is formed. If the drops are relatively small, then the drops will reach the required concentration for spreading after a short time. If the drops are relatively large, then the drops will reach the required concentration for spreading after a longer time. In the case where a combination of both large drops and small drops are formed on substrate 102, the small drops will spread almost instantly when active nitrogen 118A or with group-V vapor 118B is first introduced, whereas the large drops will remain unspread. With further exposure to active group-V matter, the wetting layer formed by the small drops will begin to solidify and eventually convert into an amorphous layer, while the large drops are only beginning to spread. The eventual undesirable result is large drops spread on the existing amorphous layer. Therefore, it is important that the size of solution drops 122C be substantially uniform. In particular, the difference in the diameter of solution drops 122C must not exceed a factor of 2. This is achieved by appropriate selection of the type of substrate 102, the temperature of group-III metal vapor source 104 and of substrate 102, as well as the vacuum pressure. It is noted, that system 100 of FIG. 1 may further include a meter (not shown) for measuring the thickness of the wetting layer formed on substrate 102.

With reference to FIG. 2E, plasma source 108 (FIG. 1) continues to direct active nitrogen 118A (or group-V vapor source 105 continues to direct other group-V vapor 118B) toward wetting layer 122D. Active nitrogen 118A or other group-V vapor 118B reacts with the group-III metal atoms on the surface of wetting layer 122D, forming new group III-V molecules (e.g., according to the chemical reaction: Ga+N→GaN). The group III-V material molecules diffuse into the bulk of the group III-V/group-III solution, increasing its level of viscosity. The reaction gradually uses up more and more group-III metal atoms, producing a greater amount of group III-V molecules, which further increase the viscosity of the solution. After a sufficient duration, all the group-III metal has been exhausted and wetting layer 122D has transformed into a highly viscous film with a solid-like form, which is an amorphous layer 122E.

Prior to the formation of amorphous layer 122E, wetting layer 122D may be thickened by adding more group-III metal. Wetting layer 122D may also be doped, at the thickening stage and before the reactive stage (the reaction of active group-V matter with group-III metal to form group III-V material), resulting in an amorphous layer containing dopants. For example, p-type magnesium may be used for doping a group III-V material.

Additional layers may be formed on top of the amorphous group III-V layer, where the previous formed amorphous layer acts as a substrate for subsequent layers. For example, a series of thin amorphous layers may be formed in succession, thereby producing a thicker amorphous layer. The thin layers may alternate between different materials, for example different group-III metal nitrides (e.g., AlN—GaN—InN, or mixtures thereof etc). Alternatively, a crystalline layer of group III-V crystal may also be grown on the amorphous layer. It is noted that amorphous layers are excellent buffers for thermal deformation of different crystalline phases.

By annealing adjacent amorphous layers of different group III-V materials, a group III-V material alloy may be formed, such as a layer containing both gallium and aluminum nitride (i.e., having the formula $Al_xGa_yN$). It is noted that alternating layers can produce quantum wells, whereas various annealing/cooling schemes can produce quantum dots and microcrystals, as will be herein after described in further detail with reference to FIGS. 6A and 6B.

It has been found experimentally that an amorphous gallium nitride layer having a thickness greater than approximately 0.5 micron (i.e., in a single layer) can be fabricated in accordance with the disclosed technique. It is noted, that when GaN is formed, the concentration of the active nitrogen must reach a point beyond saturation. Furthermore, the active nitrogen must be applied for a sufficiently long time. During experimental proceedings, it was found that a period of 120 seconds resulted in the formation of amorphous GaN, whereas shorter periods of 90 seconds or 75 seconds resulted in the formation of a GaN crystal layer on top of the wetting layer (i.e., where the crystal is grown by cooling). Crystallization may occur if a non-saturated solution is allowed to cool. Crystals may also form on the surface of a thick wetting layer during further exposure to active nitrogen, if there is a high GaN concentration gradient on the surface of the thick wetting layer, such that the diffusion rate cannot lower this gradient.

According to another embodiment of the disclosed technique, the substrate may be brought to a temperature different than room temperature, before introducing the group-III metal vapors and the active group-V matter to the active surface of the substrate. In this case, a heater 106 (shown in dotted lines in FIG. 1) is coupled with substrate 102. Heater 106 heats substrate 102 to a temperature higher than room temperature (e.g., approximately 650° C.), before the introduction of group-III metal vapors 116 and group-V matter 118A or 118B. It has been found experimentally, that an amorphous gallium nitride layer can be fabricated in accordance with the disclosed technique, when the substrate was heated to various temperatures, ranging between room temperature and approximately 650° C. It has been further experimentally found, that an amorphous gallium arsenide (GaAs) layer can be fabricated in accordance with the disclosed technique, when the substrate was heated to various temperatures, ranging between room temperature and approximately 350° C. It is further noted that if indium is used as the group-III metal, then the required temperature would be somewhat lower than 650° C., while if aluminum is used, then the required temperature would be somewhat higher than 650° C.

In a further embodiment of the disclosed technique, the amorphous group III-V layer is formed by continually heating the wetting layer for a longer period after nitridation, such that the group-III metal atoms remaining in the solution are evaporated, rather than by introducing additional active group-V matter to react with the group-III metal atoms.

Figure 3:
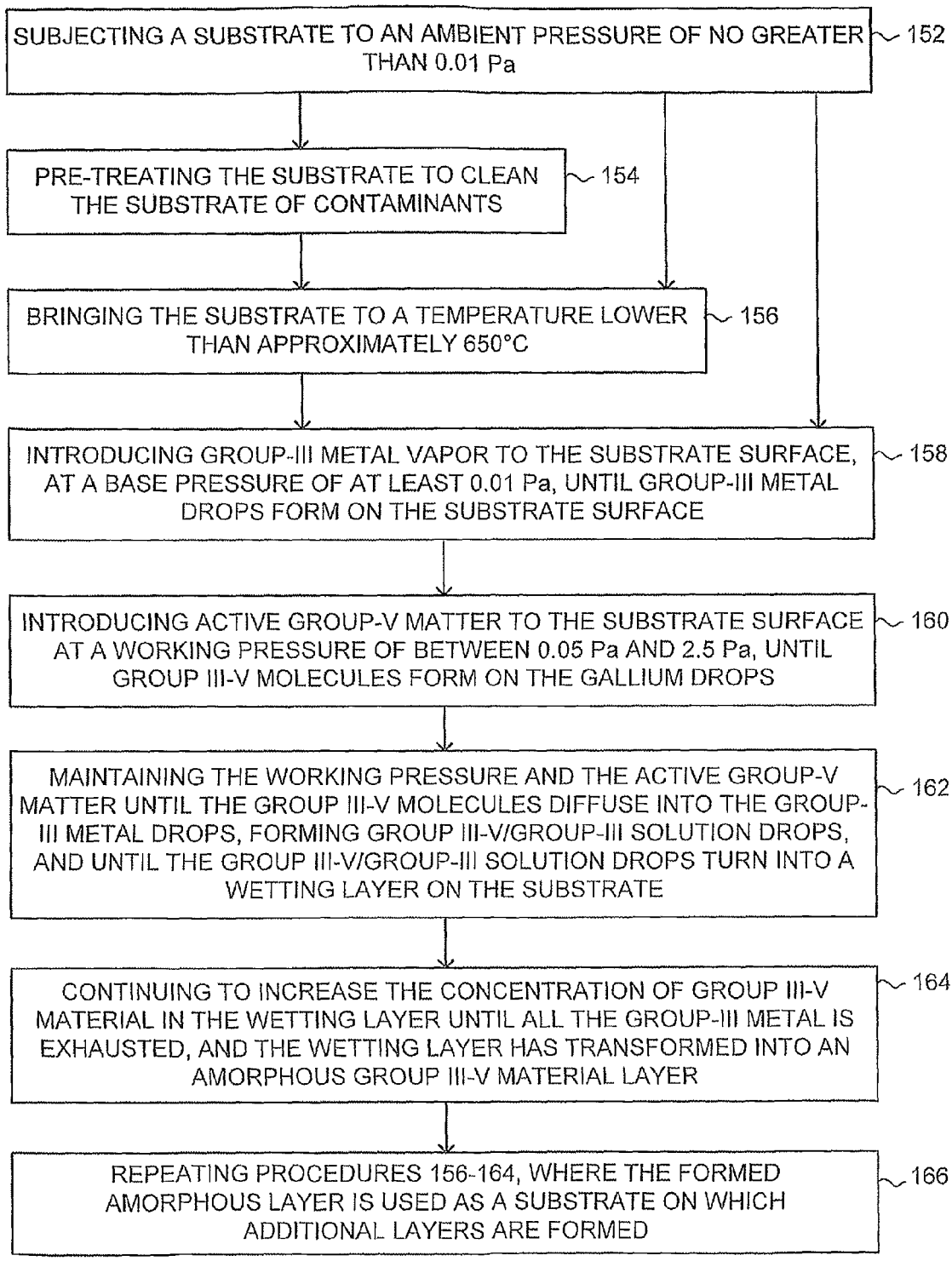
FIG. 3 is a schematic illustration of a method for amorphous group III-V material formation, operative in accordance with a further embodiment of the disclosed technique.

Reference is now made to FIG. 3, which is a schematic illustration of a method for amorphous group III-V material formation, operative in accordance with a further embodiment of the disclosed technique. In procedure 152, a substrate is subjected to an ambient pressure of no greater than 0.01 Pa, at which pressure there is less oxygen present in the vacuum chamber than is needed to form an oxide layer. With reference to FIG. 1, substrate 102 is placed inside vacuum chamber 112. The pressure inside vacuum chamber 112 is brought to a pressure of no greater than 0.01 Pa, by pumping out the gas inside vacuum chamber 112 using vacuum pump 114.

In procedure 154, the substrate is pre-treated, in order to clean the substrate of any contaminants that may be present. It is noted that procedure 154 is optional, and that the method depicted in FIG. 3 may proceed directly from procedure 152 to procedure 156. With reference to FIG. 1, substrate 102 is pre-treated to dispose of possible contaminants. Removal of contaminants may be carried out by heating, or by other means.

In procedure 156, the substrate is brought to a temperature lower than approximately 650° C. When nitrogen is used (e.g., to form amorphous GaN), the substrate may be brought to a temperature lower than approximately 650° C. (e.g., between 25° C. and 650° C.). When arsenic is used (e.g., to form amorphous GaAs), the substrate may be brought to a temperature ranging between room temperature and approximately 350° C. When phosphorous is used (e.g., to form amorphous GaP), the substrate may be brought to a temperature ranging between room temperature and approximately 300° C. With reference to FIG. 1, heater 106 heats substrate 102 to a temperature higher than room temperature. It is noted that procedure 156 is optional, and that the method depicted in FIG. 3 may proceed directly from procedure 152 or 154 to procedure 158. Thus, the substrate can either remain at room temperature, or brought to a different temperature.

In procedure 158, group-III metal vapor is introduced to the substrate surface at a base pressure of at least 0.01 Pa, until group-III metal drops form on the substrate surface. This pressure is suitable for group-III metal formation, since a higher base pressure would contain oxygen and other gasses, which are undesirable. With reference to FIGS. 1 and 2A, group-III metal vapor source 104 emits group-III metal vapor 116 toward the active surface of substrate 102, until group-III metal liquid drops 122A are formed on substrate 102. Vacuum pump 114 is employed to apply a pressure inside vacuum chamber 112 of at least 0.01 Pa. It is suggested that the group-III metal vapor be introduced at a base pressure of at least 0.01 Pa, although a higher pressure might be employed (i.e., by adding a noble gas or pure nitrogen).

In procedure 160, active group-V matter is introduced to the substrate surface, at a sub-atmospheric pressure selected from the range of between approximately 0.05 Pa and approximately 2.5 Pa, until group III-V molecules form on the group-III metal drops. This sub-atmospheric pressure is also referred to as the "working pressure". As the group-V vapor or nitrogen plasma is introduced to the group-III metal drops, the active group-V matter reacts with the group-III metal atoms on the outer shell of group-III metal drops, thereby resulting in the formation of group III-V material molecules on the group-III metal drops. It is noted that group-III metal vapor 116 may continue to be emitted during procedure 160. With reference to FIGS. 1 and 2B, gas supply 110 directs pure nitrogen 120 toward plasma generator 107. Plasma generator 107 ignites pure nitrogen 120 into active nitrogen 118A (e.g., N or N+). Plasma source 108 directs active nitrogen 118A toward the active surface of substrate 102. Alternatively or additionally, group-V vapor source 105 directs group-V vapor 118B, other than nitrogen, toward the active surface of substrate 102. Atoms of active nitrogen 118A or group-V vapor 118B reacts with the group-III metal atoms on the outer shell of group-III metal drops 122B, resulting in the formation of group III-V molecules 124 on group-III metal drops 122B.

In procedure 162, the working pressure around the substrate and the directed stream of active group-V matter are maintained, until the group III-V molecules diffuse into the group-III metal drops, forming group III-V/group-III solution drops, and until the group III-V/group-III solution drops turn into a wetting layer on the substrate. It is noted that group-III metal vapor 116 may continue to be emitted during procedure 162. With reference to FIGS. 1, 2C and 2D, active group-V matter 118A or 118B is kept directed toward the active surface of substrate 102, until group III-V molecules 124 begin to diffuse into the liquid group-III metal inside group-III metal drops 122B, eventually forming group III-V/group-III solution drops 122C. The working pressure is maintained inside plasma source 108. Active group-V matter 118A or 118B is maintained, until the surface tension of group III-V/group-III solution drops 122C decreases. Group III-V/group-III solution drops 122C turn into uniform wetting layer 122D, covering the entire active surface of substrate 102.

In procedure 164, the concentration of group III-V material in the wetting layer continues increase, until all the group-III metal is exhausted, and the wetting layer has transformed into an amorphous group III-V material layer. The concentration of group III-V material in the wetting layer may be increased by maintaining the directed stream of active group-V matter, allowing the active group-V matter to react with the group-III metal atoms on the surface of the wetting layer. Alternatively, the increase in concentration of group III-V material is achieved by heating the substrate to evaporate the remaining group-III metal atoms. It is noted that group-III metal vapor 116 may continue to be emitted during procedure 164. With reference to FIGS. 1 and 2E, active group-V matter 118A or 118B is kept directed toward wetting layer 122D. The group-III metal atoms on the surface of wetting layer 122D react with active group-V matter 118A or 118B, forming new group III-V material molecules, which diffuse into the bulk of the solution, increasing its level of viscosity. Eventually all the group-III metal is exhausted, and wetting layer 122D has transformed into amorphous layer 122E. Alternatively, substrate 102 is kept heated after directing active group-V matter, until all the group-III metal atoms remaining in wetting layer 122D evaporate, and wetting layer 122D has transformed into amorphous layer 122E.

In procedure 166, procedures 156, 158, 160, 162 and 164 are repeated indefinitely, where the formed amorphous group III-V material layer is used as a substrate on which additional layers are formed. For example, a series of thin amorphous layers are formed in succession, to produce a thicker amorphous group III-V material layer. Alternatively, a group III-V material crystal layer may be grown on the amorphous layer. Further alternatively, a group III-V material alloy may be formed, by annealing adjacent amorphous layers.

Figure 4A:
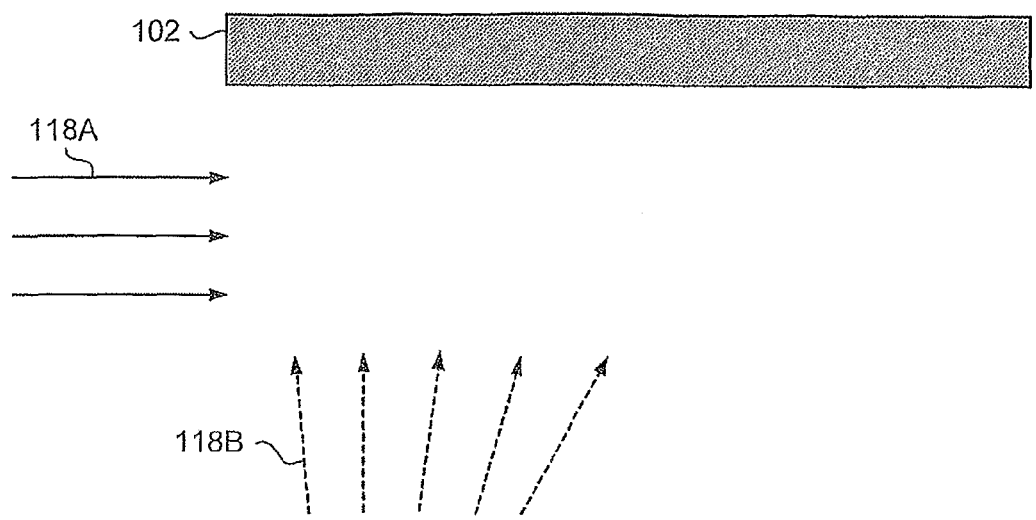
FIG. 4A is a schematic illustration of the substrate of the system of FIG. 1, at a stage when active group-V matter is introduced to the substrate, in accordance with another embodiment of the disclosed technique.
Figure 4B:
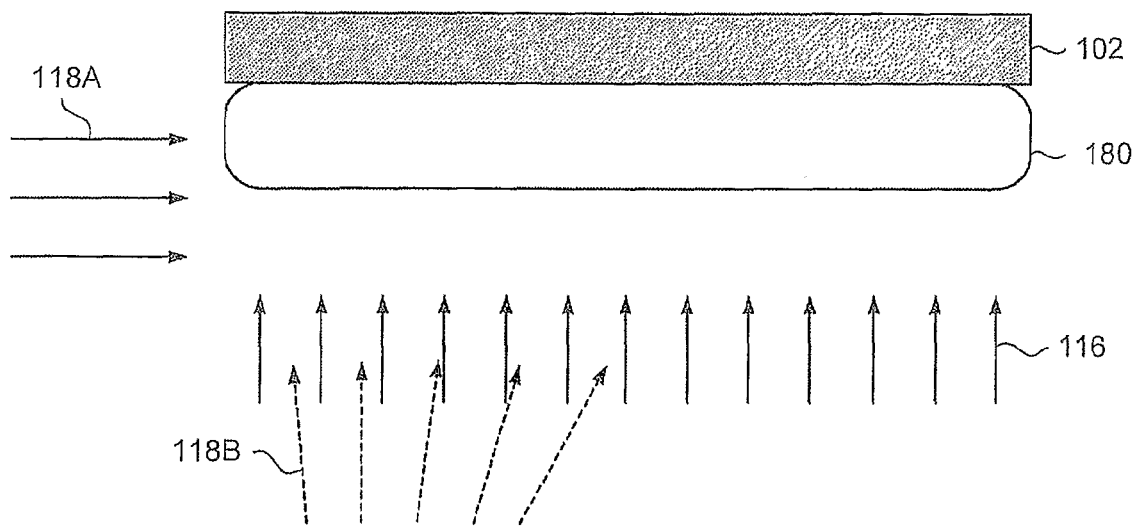
FIG. 4B is a schematic illustration of the substrate of FIG. 4A at a further stage, when a solid group III-V material amorphous layer is formed on the substrate.

Reference is now made to FIGS. 4A and 4B. FIG. 4A is a schematic illustration of the substrate of the system of FIG. 1, at a stage when active group-V matter is introduced to the substrate, in accordance with a further embodiment of the disclosed technique. FIG. 4B is a schematic illustration of the substrate of FIG. 4A at a further stage, when a solid group III-V material amorphous layer is formed on the substrate.

With reference to FIG. 4A, substrate 102 (FIG. 1) is placed inside vacuum chamber 112. The pressure inside vacuum chamber 112 is brought to a pressure of no greater than 0.01 Pa, by pumping out the gas inside vacuum chamber 112 using vacuum pump 114. Plasma source 108 (FIGS. 1 and 1A) or group-V vapor source 105 (FIGS. 1 and 1B) direct active group-V matter 118A or 118B toward the active surface of substrate 102, at a sub-atmospheric pressure selected from the range of between approximately 0.05 Pa and approximately 2.5 Pa. This sub-atmospheric pressure is also referred to as the "working pressure". Active nitrogen may be used to clean and nitridize the active surface of substrate 102 of possible contaminants. Alternatively, the active surface of substrate 102 may be cleaned by other means, such as heating the substrate to a sufficiently high temperature (e.g., 850° C.).

With reference to FIG. 4B, group-III metal vapors 116 and active group-V matter (118A or 118B) are simultaneously introduced to substrate 102. Group-III metal vapor source 104 (FIG. 1) emits group-III metal vapors 116 toward the active surface of substrate 102. When gallium is used, gallium vapors which arrive at the active surface of substrate 102, are generated at a temperature of approximately 1000° C. Vacuum pump 114 is employed to bring the base pressure inside vacuum chamber 112 to at least 0.01 Pa. Active group-V matter (118A or 118B) reacts with the group-III metal atoms of group-III metal vapors 116, resulting in the formation of group III-V molecules. When gallium and nitrogen are used, the chemical reaction is: Ga+N→GaN. Thus, a solid amorphous group III-V material layer 180 is formed on the active surface of substrate 102. The presently described method of forming a group III-V material amorphous layer may also be referred to as "reactive evaporation".

It is noted, that the presently described embodiment of the disclosed technique may be performed while bringing substrate 102 to different temperatures (e.g., by using heater 106 of FIG. 1). After group III-V material layer 180 is formed, substrate 102 as well as group III-V material layer 180, are allowed to cool, and be brought to room temperature.

Group III-V layer 180 may exhibit different inner textures, for example, group III-V layer 180 may be amorphous ("A"), or it may be Amorphous-Nano-Crystallite (ANC, i.e., amorphous with group III-V nano-crystallites of a uniform or varying size). The inner texture of group III-V layer 180 depends, among other parameters, on the temperature of substrate 102 during the introduction of active group-V matter 118A or 118B and group-III metal vapors 116. When substrate 102 remains at room temperature during the introduction of active group-V matter 118A or 118B and group-III metal vapors 116, group III-V material layer 180 is formed as an amorphous layer, having substantially no crystalline structures therein.

However, when substrate 102 is heated to a temperature of between approximately 200° C.-650° C., during the introduction of active group-V matter 118 and group-III metal vapors 116, and there after allowed to cool, group III-V layer 180 is an amorphous layer, having nano-crystallites embedded therein (i.e., an ANC layer). In the case where GaN is formed, if substrate 102 is heated to a temperature of approximately 300° C. and allowed to cool at a certain cooling rate, then the nano-crystallites embedded in the GaN layer will be of relatively small size (e.g., between approximately 3-4 nm). If substrate 102 is heated to a temperature of approximately 500° C. and allowed to cool at the same cooling rate, then the nano-crystallites embedded in the GaN layer will be of relatively large size (e.g., approximately 10-20 nm). It is noted that the heavier the group-V elements used (e.g., phosphorous or arsenic), the lower the temperatures for heating the substrate may be.

The size of the embedded nano-crystallites also depends on the thickness of group III-V ANC layer 180. The thickness of group III-V ANC layer 180 depends on the amount of time, during which active group-V matter 118A or 118B and group-III metal vapors 116 are introduced toward substrate 102. During experimental proceedings, it was found that a period of 120 seconds, and substrate temperature of approximately 400° C., resulted in the formation of an amorphous GaN layer having thickness of 25 nm.

If group III-V ANC layer 180 is relatively thin (e.g., 40 nm), then the nano-crystallites embedded therein will be of relatively small size. If group III-V ANC layer 180 is relatively thick (e.g., 60 nm) then the nano-crystallites embedded therein will be of relatively large size. Furthermore, in thinner layers, the nano-crystallites will be evenly sized, whereas in thicker layers more variations in nano-crystallite size may be present. Therefore, by controlling the temperature of the substrate during the introduction of active group-V matter and group-III metal vapors, the duration of introduction, and the cooling rate of the amorphous layer, one can regulate the density, size and composition of the nano-crystallites embedded in the formed group III-V ANC layer.

It is noted, that the group III-V amorphous layer may be doped with any desired dopant, by introducing the desired dopant along with the group-III metal vapors toward the active surface of the substrate. In this manner, the molecules of the introduced dopant will be embedded in the group III-V amorphous layer. The concentration of dopant in the amorphous layer depends on the amount of introduced dopant.

Figure 5:
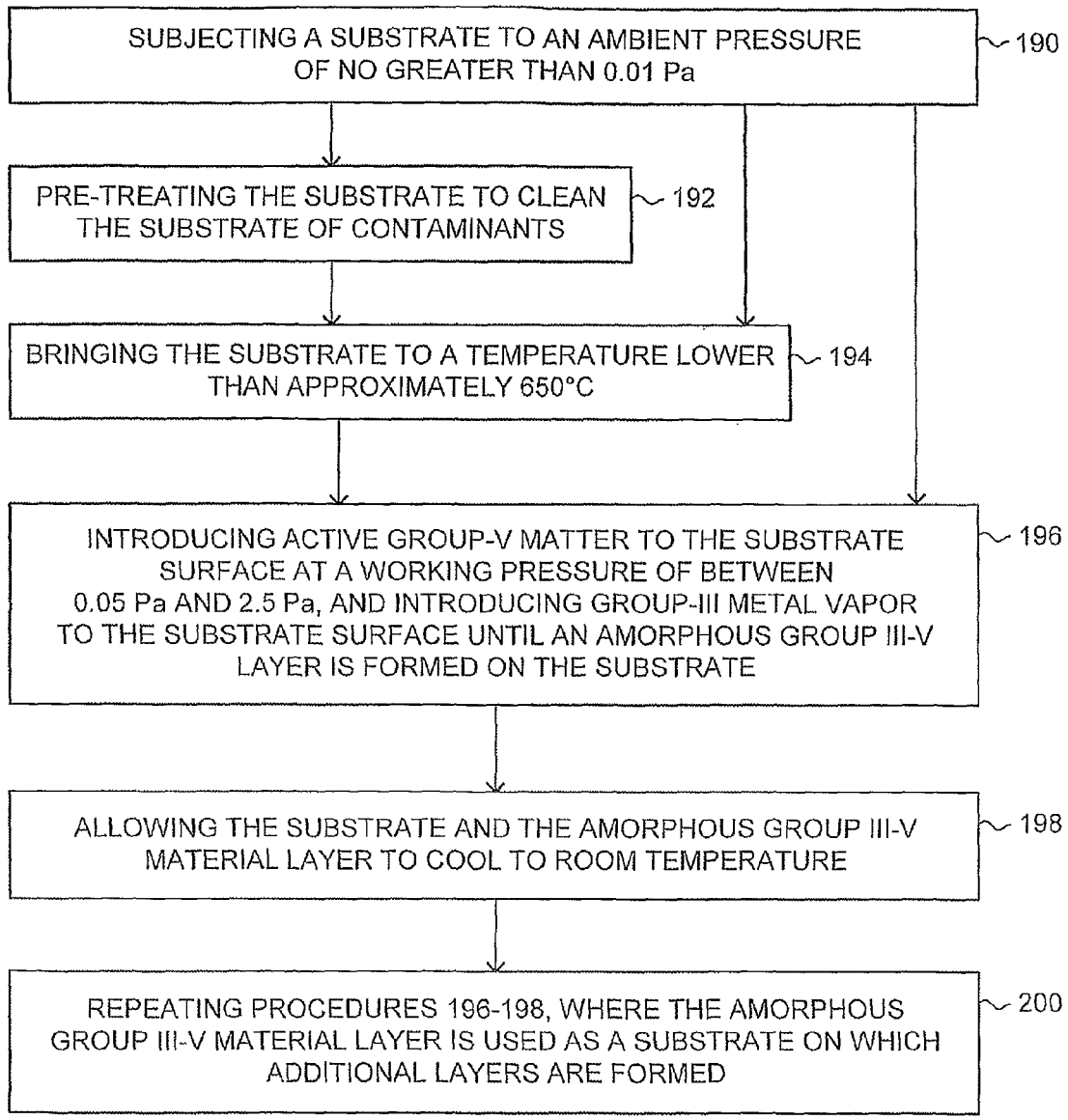
FIG. 5 is a schematic illustration of a method for amorphous group III-V material formation, operative in accordance with a further embodiment of the disclosed technique.

Reference is now made to FIG. 5, which is a schematic illustration of a method for amorphous group III-V material formation, operative in accordance with a further embodiment of the disclosed technique. In procedure 190, a substrate is subjected to an ambient pressure of no greater than 0.01 Pa. With reference to FIG. 1, substrate 102 is placed inside vacuum chamber 112. The pressure inside vacuum chamber 112 is brought to a pressure of no greater than 0.01 Pa, by pumping out the gas inside vacuum chamber 112 using vacuum pump 114.

In procedure 192, the substrate is pre-treated, in order to clean the substrate of any contaminants that may be present. It is noted that procedure 192 is optional, and that the method depicted in FIG. 5 may proceed directly from procedure 190 to procedure 194 or 196. With reference to FIG. 4A, active group-V vapor 118A or 118B cleans (and nitridizes, in case of active nitrogen 118A) the active surface of substrate 102 of possible contaminants. Alternatively, the active surface of substrate 102 may be cleaned by other means, such as heating the substrate to a sufficiently high temperature (e.g., 850° C.).

In procedure 194, the substrate is brought to a temperature lower than approximately 650° C. (e.g., between 25° C. and 650° C.). With reference to FIG. 4B, the presently described embodiment of the disclosed technique may be performed while bringing substrate 102 to different temperatures (e.g., by using heater 106 of FIG. 1). When nitrogen is used (e.g., to form amorphous GaN), the substrate may be brought to a temperature lower than approximately 650° C. (e.g., between 25° C. and 650° C.). When arsenic is used (e.g., to form amorphous GaAs), the substrate may be brought to a temperature ranging between room temperature and approximately 350° C. When phosphorous is used (e.g., to form amorphous GaP), the substrate may be brought to a temperature ranging between room temperature and approximately 300° C. It is noted that procedure 194 is optional, and that the method depicted in FIG. 5 may proceed directly from procedure 190 or 192 to procedure 196. Thus, the substrate can either remain at room temperature, or brought to a different temperature.

In procedure 196, active group-V matter is introduced to the substrate surface, at a sub-atmospheric pressure selected from the range of between approximately 0.05 Pa and approximately 2.5 Pa, and group-III metal vapor is introduced to the substrate surface. The sub-atmospheric pressure of the active group-V matter is also referred to as the "working pressure". Procedure 196 is performed until an amorphous group III-V material layer is formed on the substrate. With reference to FIG. 4B, active group-V matter 118A or 118B reacts with the group-III metal atoms of group-III metal vapors 116, resulting in the formation of a solid amorphous group III-V material layer 180 on the active surface of substrate 102.

In procedure 198, the substrate and the amorphous group III-V material layer is allowed to cool to room temperature. With reference to FIG. 4B, after group III-V material layer 180 is formed, substrate 102 as well as group III-V material layer 180 are allowed to cool, and brought to room temperature.

In procedure 200, procedures 196 and 198 are repeated time after time, where the amorphous group III-V material layer is used as a substrate on which additional layers are formed. For example, a series of thin amorphous layers are formed in succession, to produce a thicker amorphous group III-V material layer. Alternatively, a group III-V material crystalline layer may be grown on the amorphous layer. Further alternatively, each layer may have a different inner texture, such as amorphous, partly crystalline, and having varying density of crystallites, size and composition of crystallite structures. It is noted, that procedure 200 is optional, and the method depicted in FIG. 5 may terminate after procedure 198 is performed once, and only one amorphous group III-V material layer is formed.

According to another embodiment of the disclosed technique, a sequence of a plurality of amorphous group III-V material layers, one on top of the other, may be produced, providing quantum dots. Each layer of the sequence may have a different inner texture, such as amorphous (A), ANC, and having varying density of crystallites, crystallite composition and crystallite size therein. Once a desired group III-V material layer is formed on the substrate, it is allowed to cool to room temperature, before forming another layer on top. The amorphous group III-V material layer is then used as a substrate on which an additional layer is formed. After the layer and the substrate are cooled, the substrate may be brought to a desired temperature, and active group-V matter and group-III metal vapors are applied once again to the already formed layer, until the formation of another desired group III-V material layer, also by reactive evaporation. It is noted that heating a layer, after it is formed, in order to form another layer on top, does not affect the inner structure of the layer (or layers) already formed. In other words, annealing does not damage the already formed layers.

Figure 6A:
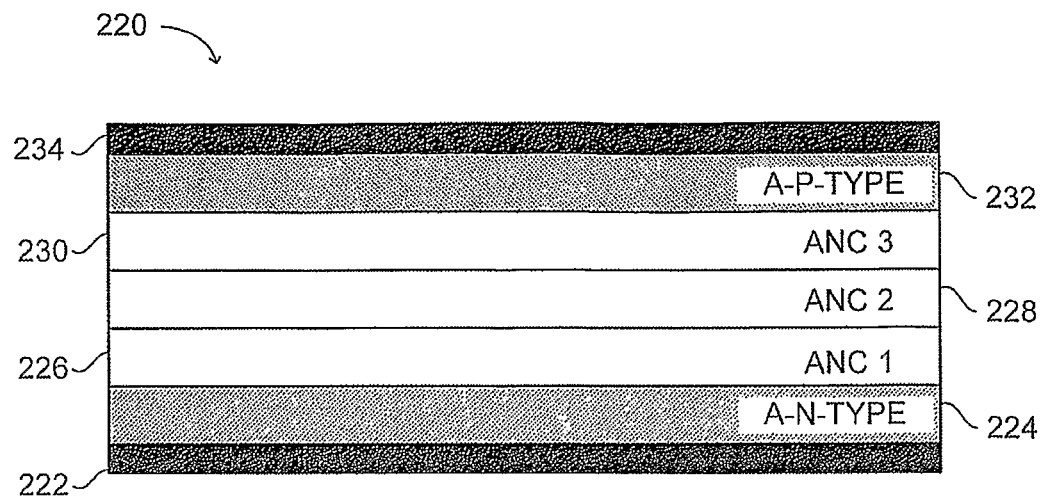
FIG. 6A is a schematic illustration of a quantum dot electronic device, constructed and operative according to another embodiment of the disclosed technique.
Figure 6B:
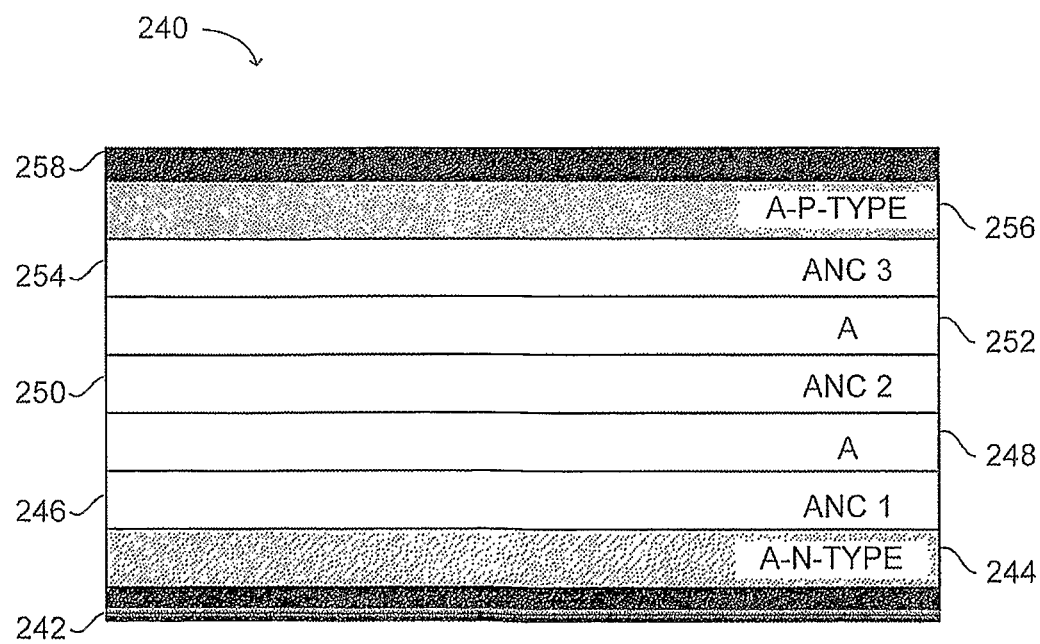
FIG. 6B is a schematic illustration of a quantum dot electronic device, constructed and operative according to a further embodiment of the disclosed technique.

A quantum dot electronic device may be constructed by capping a layer of amorphous-nano-crystallite (ANC) semiconductor material with an amorphous layer on each end thereof, each of the amorphous layers being doped with an n-type and p-type material, alternately. Reference is now made to FIGS. 6A and 6B. FIG. 6A is a schematic illustration of a quantum dot electronic device, produced according to a further embodiment of the disclosed technique. FIG. 6B is a schematic illustration of a quantum dot electronic device, produced according to another embodiment of the disclosed technique.

In FIG. 6A, quantum dot device 220 includes a sequence of amorphous group III-V material layers, stacked between a first electrode 222 on the one end thereof, and a second electrode 234 on the other end thereof. First electrode 222 (hereinafter also referred to as substrate 222) is the substrate on which quantum dot device 220 is formed, and is constructed of a conductive material, for example, stainless steel. The amorphous group III-V material layers of quantum dot device 220 may be formed by reactive evaporation, according to the technique described herein above with reference to FIGS. 4A, 4B and 5.

An amorphous group III-V layer doped with n-type material (hereinafter, A-n-type layer 224) is formed on substrate 222. After its formation, A-n-type layer 224 is allowed to cool to room temperature. Subsequently, a first amorphous-nano-crystallite (ANC) group III-V layer (hereinafter, $ANC_1$ layer 226), is formed on top of A-n-type layer 224. Then, a second ANC group III-V layer (hereinafter, $ANC_2$ layer 228), is formed on top of $ANC_1$ layer 226. A third ANC group III-V layer (hereinafter, $ANC_3$ layer 230), is formed on top of $ANC_2$ layer 228. Finally, an amorphous group III-V layer doped with p-type material (hereinafter, A-p-type layer 232) is formed on top of $ANC_3$ layer 230. Each amorphous layer of quantum dot device 220 is allowed to cool to room temperature, before the formation of another subsequent amorphous layer on top. Each of the ANC layers $ANC_1$ 224, $ANC_2$ 226 and $ANC_3$ 228 may exhibit different crystallite composition and size, according to the desired function of quantum dot device 220.

Second electrode 234 is attached to A-p-type layer 232, after it is allowed to cool to room temperature. Second electrode 234 is constructed of a conductive material, for example, titanium nitride (TiN). When TiN is used, second electrode 234 may be formed also by reactive evaporation, by introducing titanium vapors (i.e., instead of group-III metal vapors in the above description), as well as active nitrogen to the vacuum chamber. Although in the present description quantum dot device 220 includes only three ANC layers, it is noted that it may include any other number of ANC layers, according to the design and operational requirements thereof. For example, if the designer of quantum dot device 220 wishes to obtain a thicker device, more than three ANC layers may be formed between first electrode 222 and second electrode 234. Alternatively, a certain sequence of ANC layers may be repetitively formed (i.e., stacked) one on top of the other, until a desired thickness is obtained.

Quantum dot device 220 may be employed, for example, as a light emitting diode (LED). When electric current is applied between first electrode 222 and second electrode 234, such an LED would emit light of a wavelength, equal to the band gaps of the materials forming ANC layers $ANC_2$ 224, $ANC_2$ 226 and $ANC_3$ 228. It is noted, that the band gap energy of the ANC layers (i.e., the wavelengths of the light emitted from such a diode), depends upon the chemical composition of each of the ANC layers and on the size of nano-crystallites determining the size of the quantum dot. When a variety of crystalline compositions and quantum dot size is employed with each of the ANC layers, a variety of wavelengths may be emitted from such an LED, yielding a broad spectrum light, for example, a white light LED, or a selection of desired wavelengths to fit a particular purpose (e.g., particular wavelengths to which an exposed tissue is responsive during a medical procedure). GaN may be preferable for a LED, since amorphous GaN is typically transparent (i.e., has a relatively low absorption coefficient), allowing photons emitted from an inner ANC layer to pass through the other layers and exit the LED, without being absorbed in the other GaN layers.

Alternatively, quantum dot device 220 may be employed as a photovoltaic (PV) cell. If electrodes are coupled to each end of the p-i-n junction of the PV cell and light is irradiated onto quantum dot device 220, then the electrodes become electrically charged. When quantum dot device 220 is connected to an external circuit, an electric current is generated between first electrode 222 and second electrode 234. If each of the ANC layers is constructed to absorb light of a different wavelength, then quantum dot device 220 may be employed as a solar cell, absorbing photons of various wavelengths of the broad spectrum light of sunlight and turning it into electric current. A quantum-dot LED and a quantum-dot PV cell may be employed as a head-tail communication device, including a compatible (e.g., GaN) superiorly amorphous waveguide connecting there between. The quantum-dot LED functions as a photonic source, generating an optical signal. The optical signal is then transferred along the superiorly amorphous layer (i.e., waveguide), until reaching the quantum-dot PV cell. The quantum-dot PV cell may decode the optical signal, by turning the optical signal into an electronic signal. It is noted, that since the structure of the quantum-dot LED and quantum-dot PV cell is substantially similar, their functions may interchange at the ends of the waveguide. The waveguide amorphous layer may be of a substantially one dimensional form, for example, a long and thin structure.

In FIG. 6B, a quantum dot device 240 includes a sequence of amorphous group III-V layers, stacked between a first electrode 242 on the one end thereof, and a second electrode 258 on the other end thereof. First electrode 242 is the substrate on which quantum dot device 240 is formed, and is constructed of a conductive material, for example, stainless steel. It is noted, that the amorphous group III-V material layers of quantum dot device 240 may be formed by reactive evaporation, according to the technique described herein above with reference to FIGS. 4A and 4B.

An A-n-type layer 244 is formed on first electrode 242. Subsequently, a first ANC group III-V material layer (hereinafter, ANC$_1$ layer 246), is formed on top of A-n-type layer 244. Then, a superiorly amorphous layer (hereinafter, "A" layer 248) is formed on top of ANC$_1$ layer 246. A second ANC layer (hereinafter, ANC$_2$ layer 250), is then formed on top of "A" layer 248. Subsequently, a second "A" layer 252 is formed of top of ANC$_2$ layer 250. A third ANC group III-V layer (hereinafter, ANC$_3$ layer 254), is formed on top of "A" layer 252. Finally, an A-p-type layer 256 is formed on top of ANC$_3$ layer 254. Each amorphous layer of quantum dot device 240 is allowed to cool to room temperature, before the formation of another subsequent amorphous layer on top. Each of the ANC layers ANC$_1$ 246, ANC$_2$ 250 and ANC$_3$ 254 may exhibit different composition and crystallite size, according to the desired function of quantum dot device 240. Second electrode 258 is attached to A-p-type layer 256, after it is allowed to cool to room temperature. Second electrode 258 is constructed of a conductive material, for example, titanium nitride (TiN).

In order to obtain an efficient quantum dot device, "A" layers 248 and 252 may be constructed of GaN or AlGaN, having a relatively high band gap energy value ($E_g$), whereas ANC layers ANC$_1$ 246, ANC$_2$ 250 and ANC$_3$ 254 may be constructed of InN or InGaN, having a relatively low band gap energy value ($E_g$). In this manner, "A" layers 248 and 252 present an efficient energy barrier to electrons located in ANC layers ANC$_1$ 246, ANC$_2$ 250 and ANC$_3$ 254. Quantum dot device 240 may be employed as an LED, a photovoltaic cell (e.g., a solar cell), an optical conductor, or a waveguide, as elaborated hereinabove with reference to quantum dot device 220 of FIG. 6A. It is noted that the quantum dot structure depicted in FIG. 6B may be employed as a multi-LED device, such as for a color monitor. For example, ANC layer ANC$_1$ 246 may be a blue quantum-dot layer, ANC layer ANC$_2$ 250 may be a green quantum-dot layer and ANC layer ANC$_3$ 254 may be a red quantum-dot layer. Setting up vertical connections (also referred to as "via connections") to the appropriate "A" layer, and biasing each ANC layer with a potential according to its respective color (i.e., blue>green>red), will provide a single color micro-LED. If the unchanged red quantum-dot layer (i.e., ANC layer ANC$_3$ 254) will be provided with electric potential respective of a blue quantum-dot layer, then a white light will be emitted.

Photoconduction is the change in the electrical conductivity of a matter as a result of absorbing electromagnetic radiation. It has been shown by Koo et al. ("*Photoconductivity in Nanocrystalline GaN and Amorphous GaON*", *Journal of Applied Physics*, Volume 99, Issue 3, pp. 034312-034312-7; 2006), that amorphous GaN films have a relatively low absorption coefficient, and high photoconductivity. On the other hand, polycrystalline films possess high absorption coefficient and low photoconductivity. Thus, stacking amorphous layers and polycrystalline layers alternatively (as described with reference to FIG. 6B), may yield an optical structure having high photo conversion and high photoconductivity. Also, such an optical structure would still be transparent (having low absorption coefficient), thereby allowing easy transmission of photons through the optical structure. Such attributes are desirable for an optoelectronic device, such as a photovoltaic cell.

It will be appreciated by persons skilled in the art that the disclosed technique is not limited to what has been particularly shown and described hereinabove. Rather the scope of the disclosed technique is defined only by the claims, which follow.

The invention claimed is:

1. Reactive evaporation method for forming a group III-V amorphous material attached to an amorphous substrate, the method comprising the procedures of:
   bringing said amorphous substrate to a temperature ranging between 200° C.-650° C.;
   subjecting said amorphous substrate to an ambient pressure of no greater than 0.01 Pa;
   introducing active group-V matter to the surface of said substrate at a working pressure of between 0.05 Pa and 2.5 Pa, and group-III metal vapor, until an amorphous group III-V material layer is formed on said surface; and
   allowing said substrate and said amorphous group III-V material layer to cool to room temperature, thereby producing an amorphous-nano-crystalline (ANC) layer, having nano-crystallites embedded therein.

2. The method according to claim 1, wherein said group-III metal comprises at least one element selected from the list consisting of aluminum, gallium, and indium.

3. The method according to claim 1, wherein said group-V matter comprises at least one element selected from the list consisting of nitrogen, arsenic and phosphorous.

4. The method according to claim 1, further comprising the procedure of pre-treating said substrate to clean said substrate of contaminants, prior to said procedure of introducing.

5. The method according to claim 4, wherein said procedure of pre-treating said substrate is o accomplished by introducing active nitrogen to said surface of said substrate.

6. The method according to claim 4, wherein said procedure of pre-treating said substrate is accomplished by heating said substrate to a temperature of approximately 850° C.

7. The method according to claim 1, further comprising the procedure of forming additional layers on said amorphous group III-V material layer, using said amorphous group III-V material layer as a substrate.

8. The method according to claim 7, wherein said additional layers include at least one layer selected from the list consisting of:
- amorphous;
- amorphous-nano-crystalline (ANC);
- amorphous doped with n-type material;
- amorphous doped with p-type material; and
- crystalline.

9. The method according to claim 1, wherein said substrate is selected from the list consisting of:
- silicon;
- glass;
- graphite; and
- polymer.

10. The method according to claim 1, wherein said procedure of introducing further includes introducing dopants to said substrate, and wherein said amorphous group III-V material layer is doped with said dopants.

11. Method for preparing a quantum dot p-i-n junction, said method comprising the procedures of:
- forming an A-n-type layer by reactive evaporation, said A-n-type layer being constructed of a group III-V material doped with n-type material, and allowing said A-n-type layer to cool to room temperature;
- forming at least one amorphous-nano-crystalline (ANC) layer on top of said A-n-type layer, by reactive evaporation, said at least one ANC layer including said group III-V material, and allowing said at least one ANC layer to cool to room temperature;
- forming an A-p-type layer by reactive evaporation on said at least one ANC layer, said A-p-type layer being constructed of said group III-V material doped with p-type material, and allowing said A-n-type layer to cool to room temperature.

12. The method according to claim 11, further comprising the procedures of:
- attaching a first electrode to said A-n-type layer;
- attaching a second electrode to said A-p-type layer;
- wherein said first electrode and said second electrode are constructed of electrically conductive material, and
- wherein said quantum dot p-i-n junction and said first and second electrodes yield a quantum dot electronic device.

13. The method according to claim 12, wherein said first electrode and said second electrode are formed by reactive evaporation.

14. The method according to claim 13, wherein said first electrode and said second electrode are constructed of a material selected from the list consisting of titanium nitride and stainless steel.

15. The method according to claim 11, wherein said at least one ANC layer includes a sequence of amorphous layers and ANC layers, formed alternately by reactive evaporation.

16. The method according to claim 11, wherein said at least one ANC layer is constructed of a material selected from the list consisting of:
- GaN;
- AlGaN;
- AlInN;
- InN;
- InGaN;
- GaAs;
- GaP;
- InP;
- InGaAs;
- AlGaAs; and
- InGaP.

* * * * *